(12) United States Patent
Saito

(10) Patent No.: US 7,161,245 B2
(45) Date of Patent: Jan. 9, 2007

(54) ELECTRONIC COMPONENT-MOUNTED STRUCTURE, METHOD FOR MOUNTING ELECTRONIC COMPONENT, ELECTRO-OPTICAL DEVICE, AND ELECTRONIC APPARATUS

(75) Inventor: Atsushi Saito, Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/216,807

(22) Filed: Aug. 31, 2005

(65) Prior Publication Data

US 2006/0060983 A1 Mar. 23, 2006

(30) Foreign Application Priority Data

Sep. 22, 2004 (JP) .............................. 2004-274625

(51) Int. Cl.
- *H01L 23/48* (2006.01)
- *H01L 23/52* (2006.01)
- *H01L 29/40* (2006.01)

(52) U.S. Cl. ...................... 257/737; 257/738; 257/782; 257/783

(58) Field of Classification Search ........ 257/737–738, 257/778, 780–783, 787, 747, 779
See application file for complete search history.

(56) References Cited

U.S. PATENT DOCUMENTS 6,388,321 B1 * 5/2002 Hirai et al. .................. 257/737
6,590,287 B1 * 7/2003 Ohuchi ........................ 257/738
2004/0182817 A1 * 9/2004 Murai et al. .................. 216/23

FOREIGN PATENT DOCUMENTS

| JP | 05-182516 | 7/1993 |
| JP | 2000-101221 | 4/2000 |
| JP | 2001-160568 | 6/2001 |

* cited by examiner

Primary Examiner—Zandra V. Smith
Assistant Examiner—Thanh Y. Tran
(74) Attorney, Agent, or Firm—Harness, Dickey & Pierce, P.L.C.

(57) ABSTRACT

An electronic component-mounted structure includes an electronic component having a bump electrode, the bump electrode including a projection made of a first resin and a conductive film covering at least a top of the projection; a substrate having a connecting terminal; and a second resin filling the space between the electronic component and the substrate, wherein the bump electrode abuts against the connecting terminal, and wherein the relationship $T0<Tgr<Tgb$ is satisfied, where $T0$ is an operating temperature of the electronic component mounted on the substrate, $Tgb$ is a glass transition temperature of the first resin, and $Tgr$ is a glass transition temperature of the second resin.

7 Claims, 9 Drawing Sheets

ELECTRONIC COMPONENT-MOUNTED STRUCTURE, METHOD FOR MOUNTING ELECTRONIC COMPONENT, ELECTRO-OPTICAL DEVICE, AND ELECTRONIC APPARATUS

RELATED APPLICATIONS

This application claims priority to Japanese Patent Application No. 2004-274625 filed Sep. 22, 2004 which is hereby expressly incorporated by reference herein in its entirety.

BACKGROUND OF THE INVENTION

1. Technical Field

The present invention relates to electronic component-mounted structures; methods for mounting electronic components; electro-optical devices, such as liquid crystal devices and light-emitting devices, e.g., organic electroluminescence (EL) devices, and inorganic EL devices; and electronic apparatuses.

2. Related Art

In circuit boards and liquid crystal display devices mounted on various types of electronic apparatuses, techniques for mounting electronic components, such as semiconductor ICs, are used. For example, in a liquid crystal display device, an IC chip for driving liquid crystal, which drives a liquid crystal panel, is mounted. The IC chip for driving liquid crystal may be directly mounted on a glass substrate constituting the liquid crystal panel or may be mounted on a flexible printed circuit board (FPC). The former mounting structure is referred to as a chip on glass (COG) structure and the latter mounting structure is referred to as a chip on FPC (COF) structure.

When a liquid crystal display device having a COG structure is fabricated, as shown in FIG. 12, an IC chip is mounted using an anisotropic conductive film (ACF) 22 in which conductive particles 22*a* are dispersed in a thermosetting resin 22*b*. That is, first, an IC chip for driving liquid crystal 21 is disposed on connecting terminals 11*bx* and 11*dx* arranged on a glass substrate 11 with the anisotropic conductive film 22 therebetween. Subsequently, the IC chip 21 is pressed to the glass substrate 11 so that metal bump electrodes 21B are brought into conductive contact with the connecting terminals 11*bx* and 11*dx* through the conductive particles 22*a*. Furthermore, the IC chip 21 is heated to cure the thermosetting resin 22*b* so that the conductive contact between the metal bump electrodes 21B and the connecting terminals 11*bx* and 11*dx* is maintained.

In order to enhance reliability of electrical connection between the metal bump electrodes 21B of the IC chip 21 for driving liquid crystal and the connecting terminals 11*bx* and 11*dx* disposed on the glass substrate 11, the intervening conductive particles 22*a* are required to be elastically deformed by pressure. In such a case, even if the height of the thermosetting resin 22*b* is changed due to a change in temperature, the conductive contact through the conductive particles 22*a* can be maintained. However, the conductive particles 22*a* having a small particle size have high rigidity and it is difficult to secure elastic deformation of the conductive particles 22*a* that is sufficient for improving reliability of electrical connection. Under these circumstances, as a method of enhancing reliability of conductive connection, use of conductive particles composed of conductive rubber has been known. For example, refer to Japanese Unexamined Patent Application Publication No. 5-182516.

However, recently, with higher resolution and increased color display with respect to liquid crystal display devices, the pitches of the metal bump electrodes 21B and the connecting terminals 11*bx* and 11*dx* have been decreasing. As a result, in order to prevent short-circuiting between adjacent electrodes or adjacent terminals, the particle size of the conductive particles 22*a* must be further decreased. Consequently, the cost of the anisotropic conductive film 22 has increased, resulting in an increase in production cost. It has also become more difficult to secure sufficient elastic deformation of the conductive particles 22*a*, resulting in a difficulty in securing reliability of electrical connection against a change in temperature. Additionally, in the method in which conductive particles composed of conductive rubber are used, it is still more difficult to decrease the particle size.

SUMMARY

An advantage of the invention is that it provides an electronic component-mounted structure and a method for mounting an electronic component in which reliability of electrical connection can be improved. Another advantage of the invention is that it provides an electro-optical device and an electronic apparatus each having excellent reliability of electrical connection.

According to an aspect of the invention, an electronic component-mounted structure includes an electronic component having a bump electrode, the bump electrode including a projection made of a first resin and a conductive film covering at least a top of the projection; a substrate having a connecting terminal; and a second resin filling the space between the electronic component and the substrate, wherein the bump electrode abuts against the connecting terminal, and wherein the relationship $T0<Tgr<Tgb$ is satisfied, where $T0$ is an operating temperature of the electronic component mounted on the substrate, $Tgb$ is a glass transition temperature of the first resin, and $Tgr$ is a glass transition temperature of the second resin.

In particular, preferably, the relationship $\alpha b1<\alpha r1$ is satisfied, where $\alpha b1$ is a thermal expansion coefficient of the first resin below the glass transition temperature $Tgb$, and $\alpha r1$ is a thermal expansion coefficient of the second resin below the glass transition temperature $Tgr$.

In these constructions, since the conductive contact between the bump electrode and the connecting terminal can be ensured, it is possible to improve reliability of electrical connection.

Furthermore, when the relationship $T0<Tgr<Tc<Tgb$ is satisfied, where $Tc$ is a curing temperature of the second resin, preferably, the relationship $\alpha b1(Tc-T0)<\alpha r2(Tc-Tgr)+\alpha r1(Tgr-T0)$ is satisfied, where $\alpha b1$ is a thermal expansion coefficient of the first resin below the glass transition temperature $Tgb$, $\alpha r2$ is a thermal expansion coefficient of the second resin above the glass transition temperature $Tgr$, and $\alpha r1$ is a thermal expansion coefficient of the second resin below the glass transition temperature $Tgr$.

Furthermore, when the relationship $T0<Tgr<Tgb<Tc$ is satisfied, where $Tc$ is a curing temperature of the second resin, preferably, the relationship $\alpha b2(Tc-Tgb)+\alpha b1(Tgb-T0)<\alpha r2(Tc-Tgr)+\alpha r1(Tgr-T0)$ is satisfied, where $\alpha b2$ is a thermal expansion coefficient of the first resin above the glass transition temperature $Tgb$, $\alpha b1$ is a thermal expansion coefficient of the first resin below the glass transition temperature $Tgb$, $\alpha r2$ is a thermal expansion coefficient of the second resin above the glass transition temperature $Tgr$, and αr1 is a thermal expansion coefficient of the second resin below the glass transition temperature Tgr.

In these constructions, even if the heights of the first resin and the second resin are decreased (contracted) during the cooling process from the curing temperature Tc of the second resin to the operating temperature T0 of the electronic component, the bump electrode can be pressed against the connecting terminal at the operating temperature T0. Consequently, it is possible to improve reliability of electrical connection.

According to another aspect of the invention, in a method for mounting an electronic component having a bump electrode on a substrate having a connecting terminal, the bump electrode including a projection made of a first resin and a conductive film covering at least a top of the projection, the method includes filling a space between the electronic component and the substrate with a second resin so that the bump electrode abuts against the connecting terminal, wherein the relationship T0<Tgr<Tgb is satisfied, where T0 is an operating temperature of the electronic component mounted on the substrate, Tgb is a glass transition temperature of the first resin, and Tgr is a glass transition temperature of the second resin.

In this construction, since the conductive contact between the bump electrode and the connecting terminal can be ensured, it is possible to improve reliability of electrical connection.

In the method described above, preferably, the bump electrode is pressed to the connecting terminal with the uncured second resin therebetween, and the second resin is cured while the bump electrode is being elastically deformed. In this construction, since the bump electrode can be pressed against the connecting terminal, it is possible to improve reliability of electrical connection.

According to another aspect of the invention, an electro-optical device includes the electronic component-mounted structure described above. In this construction, since the electro-optical device is provided with the electronic component-mounted structure capable of improving reliability of electrical connection, it is possible to provide an electro-optical device having high reliability of electrical connection.

According to another aspect of the invention, an electronic apparatus includes the electro-optical device described above. In this construction, it is possible to provide an electronic apparatus having high reliability of electrical connection.

BRIEF DESCRIPTION OF THE DRAWINGS

The invention will be described with reference to the accompanying drawings, wherein like numbers reference like elements, and wherein.

DESCRIPTION OF THE EMBODIMENTS

Figure 1:
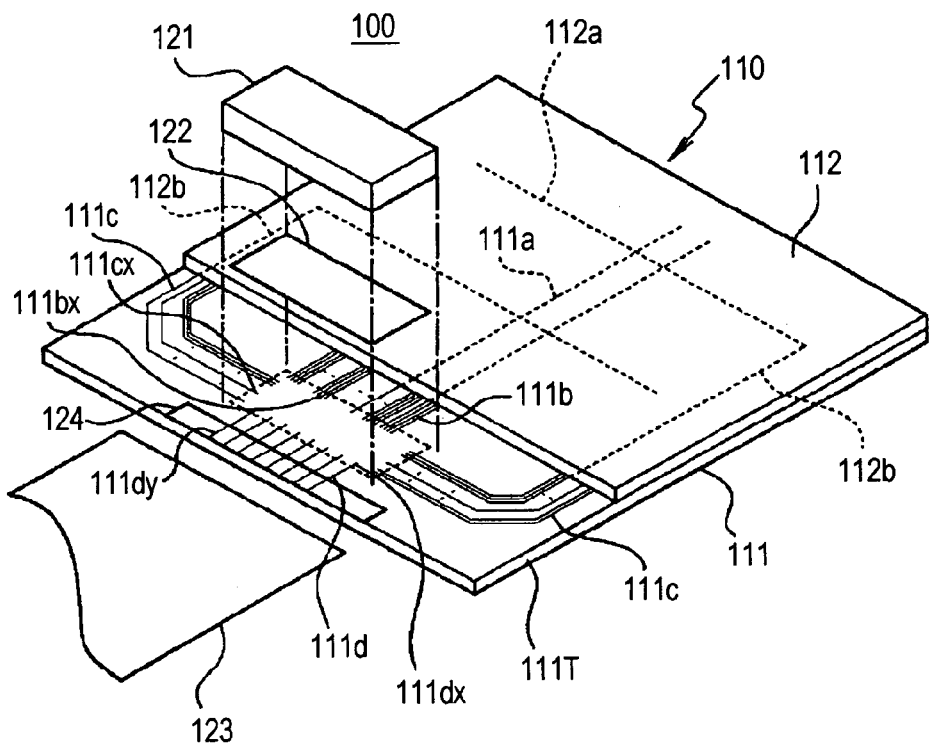
FIG. 1 is an assembly view of an electro-optical device according to an embodiment of the invention.

Embodiments of the invention will be described below with reference to the drawings. In the drawings, the scale for each element is varied appropriately so that the element is of a recognizable size.

[Electro-Optical Device]

FIG. 1 is an assembly view of an electro-optical device according to an embodiment of the invention. A liquid crystal device 100 shown in FIG. 1 includes a liquid crystal panel 110 and an electronic component (IC chip for driving liquid crystal) 121. Furthermore, according to need, the liquid crystal device 100 is appropriately provided with additional elements, such as a polarizer, a reflector sheet, and a backlight, (not shown).

The liquid crystal panel 110 includes substrates 111 and 112 which are composed of glass, plastic, or the like. The substrates 111 and 112 are arranged so as to be opposed to each other, and are bonded to each other with a sealant or the like (not shown). A liquid crystal which is an electro-optical substance (not shown) is enclosed between the substrates 111 and 112. Electrodes 111a composed of a transparent conductor, such as indium tin oxide (ITO), are disposed on the inner surface of the substrate 111. Electrodes 112a are disposed on the inner surface of the substrate 112, the electrodes 112a being arranged so as to be opposed to the electrodes 111a.

Each electrode 111a is connected to a wire 111b integrally formed using the same material, and the wire 111b is led to the inner surface of a protruding portion 111T of the substrate 111. The protruding portion 111T refers to a portion protruding from the outline of the substrate 112 in the end of the substrate 111. The end of the wire 111b corresponds to a terminal 111bx. Similarly, each electrode 112a is connected to a wire 112b integrally formed using the same material, and the wire 112b is conductively connected to a wire 111c disposed on the substrate 111 through a vertically conducting portion (not shown). The wire 111c is also composed of ITO. The wire 111c is led to the inner surface of the protruding portion 111T of the substrate 111, and the end thereof corresponds to a terminal 111cx.

On the other hand, input wires 111d are disposed near the edge of the protruding portion 111T, and the inner end of each input wire 111d corresponds to a terminal 111dx. The terminal 111dx is disposed so as to be opposed to the terminals 111*bx* and 111*cx*. Additionally, the outer end of the input wire 111*d* corresponds to an input terminal 111*dy*.

The electronic component 121 is mounted on the protruding portion 111T of the substrate 111 with a sealing resin 122 therebetween, the sealing resin 122 being composed of an uncured or semi-cured thermosetting resin. Many bump electrodes (not shown) are disposed on the lower surface of the electronic component 121, and these bump electrodes are each conductively connected to any of the terminals 111*bx*, 111*cx*, and 111*dx* disposed on the protruding portion 111T.

A flexible wiring substrate 123 is mounted through an anisotropic conductive film 124 on a region of the protruding portion 111T in which the input terminals 111*dy* are arranged. The input terminals 111*dy* are conductively connected to wires (not shown) provided on the flexible wiring substrate 123. Control signals, picture signals, power supply voltages, and the like are supplied to the input terminals 111*dy* through the flexible wiring substrate 123. The control signals, picture signals, power supply voltages, and the like supplied to the input terminals 111*dy* are input to the electronic component 121, where driving signals for driving liquid crystal are generated and supplied to the liquid crystal panel 110.

In the liquid crystal device 100 having the structure described above according to this embodiment, the electronic component 121 can apply appropriate voltages to a plurality of pixels formed at the intersections of the electrodes 111*a* and 112*a*. Thus, alignment of liquid crystal molecules can be controlled, and incident light can be modulated independently for each pixel. Consequently, a desired image can be displayed in the display area of the liquid crystal panel 110 in which a plurality of pixels are arrayed.

[Electronic Component-Mounted Structure]

Figure 2:
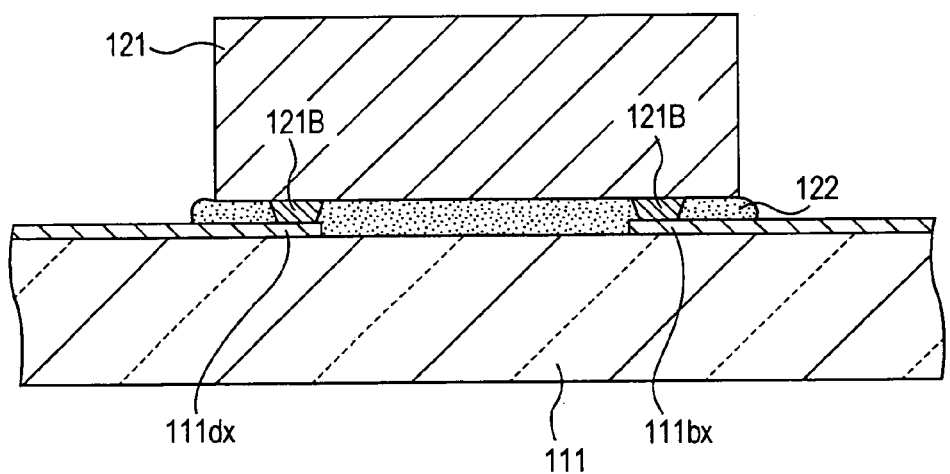
FIG. 2 is a lateral cross-sectional view showing a part of the electro-optical device shown in FIG. 1 in which an electronic component is mounted.

FIG. 2 is a lateral cross-sectional view showing a part of the electro-optical device shown in FIG. 1 in which an electronic component is mounted. As shown in FIG. 2, a plurality of bump electrodes 121B which are IC side terminals are provided on a surface (lower surface in FIG. 2) of the electronic component 121. The ends of the bump electrodes 121B are brought into conductive contact with the terminals 111*bx*, 111*cx*, and 111*dx* of the substrate 111 (111*cx* not shown in FIG. 2; refer to FIG. 1; hereinafter the same). Furthermore, a cured sealing resin 122 composed of a thermosetting resin or the like fills the area surrounding the conductive contacts between the bump electrodes 121B and the terminals 111*bx*, 111*cx*, and 111*dx*.

Figure 3:
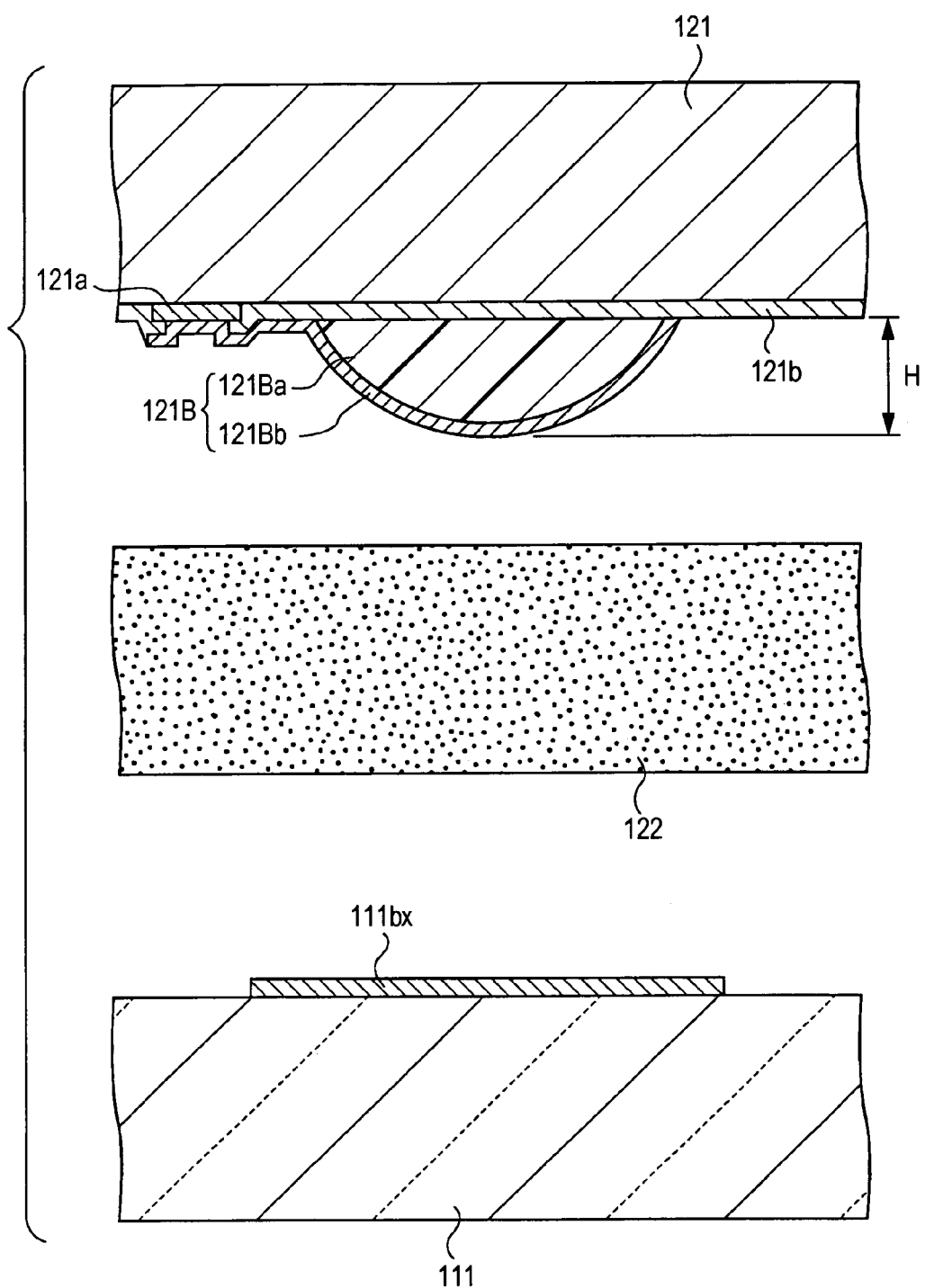
FIG. 3 is a lateral cross-sectional view showing a structure before mounting of an electronic component.
Figure 4:
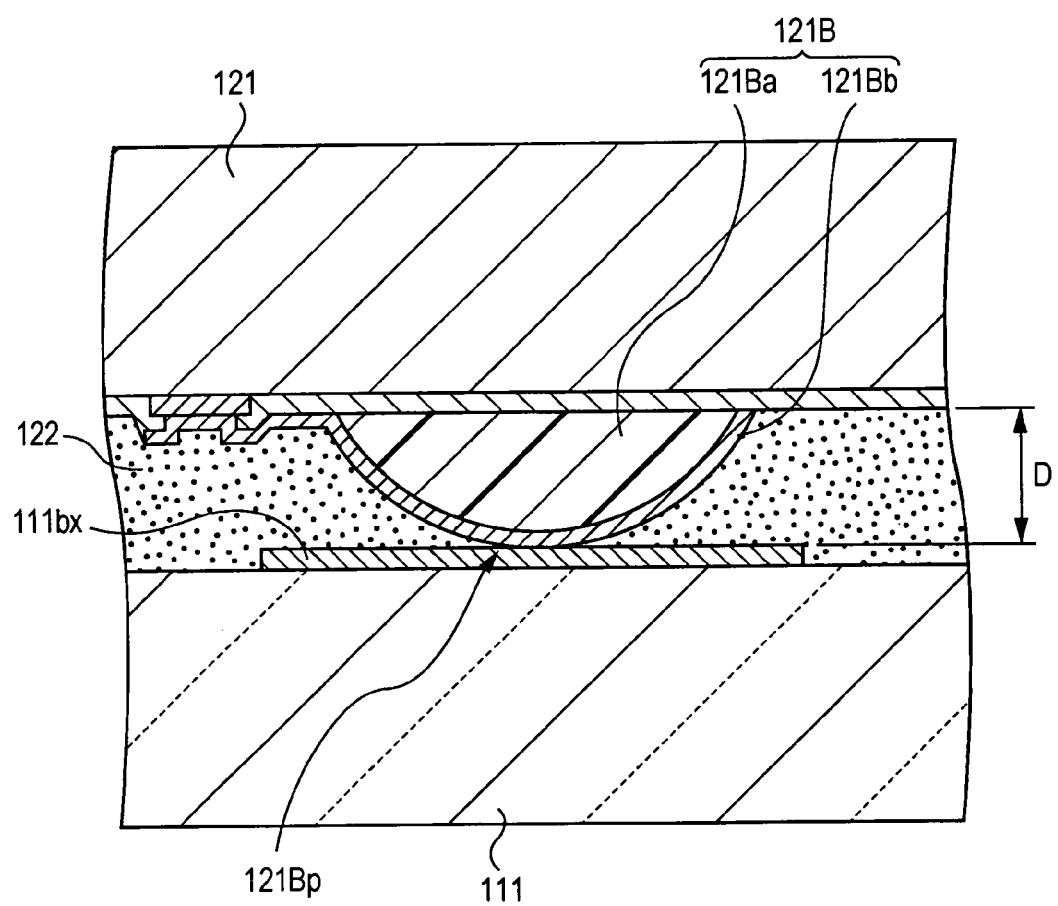
FIG. 4 is a lateral cross-sectional view showing an electronic component-mounted structure.

FIG. 3 is a lateral cross-sectional view showing a structure before mounting of an electronic component, and FIG. 4 is a lateral cross-sectional view showing an electronic component-mounted structure. An electronic component 121 shown in FIG. 3 is, for example, an integrated-circuit chip in which an appropriate electric circuit is formed on a silicon substrate. A terminal electrode 121*a* composed of aluminum or the like is led to a surface (lower surface in FIG. 3) of the electronic component 121, and a protective film 121*b*, such as a passivation film, composed of an insulating material, e.g., $SiO_2$, is disposed around the terminal electrode 121*a*. That is, the protective film 121*b* covers the surface of the electronic component 121 with the terminal electrode 121*a* being exposed.

An elastic resin projection (composed of a first resin) 121Ba is formed on the protective film 121*b* adjacent to the terminal electrode 121*a* so as to protrude from the surface of the electronic component 121. The resin projection 121Ba is formed, for example, by a method in which the surface of the protective film 121*b* is coated with an elastic resin, such as an acrylic resin or a phenol resin, and then patterning treatment, such as photolithography, is carried out. In this stage, by carrying out photolithography using a half-tone mask, the resin projection 121Ba can be formed in a semispherical shape.

A conducive film 121Bb extends over the surface of the resin projection 121Ba, the conductive film 121Bb being conductively connected to the terminal electrode 121*a*. The conductive film 121Bb is formed by vapor deposition, sputtering, or the like of a conductive metal, such as Au, Cu, or Ni, followed by appropriate patterning treatment. Furthermore, the surface of an underlying conductive film composed of Cu, Ni, Al, or the like may be further coated with Au plating or the like to enhance conducting performance.

The conductive film 121Bb is formed so as to cover at least the top of the resin projection 121Ba. The resin projection 121Ba and the conductive film 121Bb constitute the bump electrode (resin core bump) 121B. This bump electrode 121B semispherically protrudes from the surface of the electronic component 121.

Figure 8:
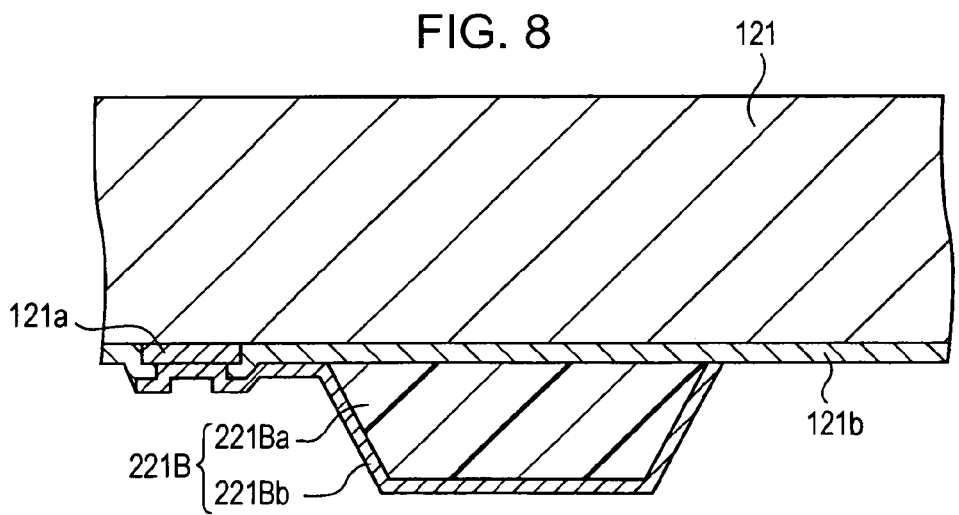
FIG. 8 is a lateral cross-sectional view showing a first variation example of the electronic component according to the embodiment of the invention.

FIG. 8 is a lateral cross-sectional view showing a first variation example of the electronic component according to this embodiment. The bump electrode can be formed in a shape other than the semispherical shape, such as a frustum of a cone, a frustum of a pyramid, a cylindrical column, or a rectangular column. In the first variation example shown in FIG. 8, the resin projection 221Ba is formed in a trapezoidal shape, and the surface thereof is covered with a conductive film 221Bb. Thus, a bump electrode 221B is formed in a trapezoidal shape.

Figure 9A:
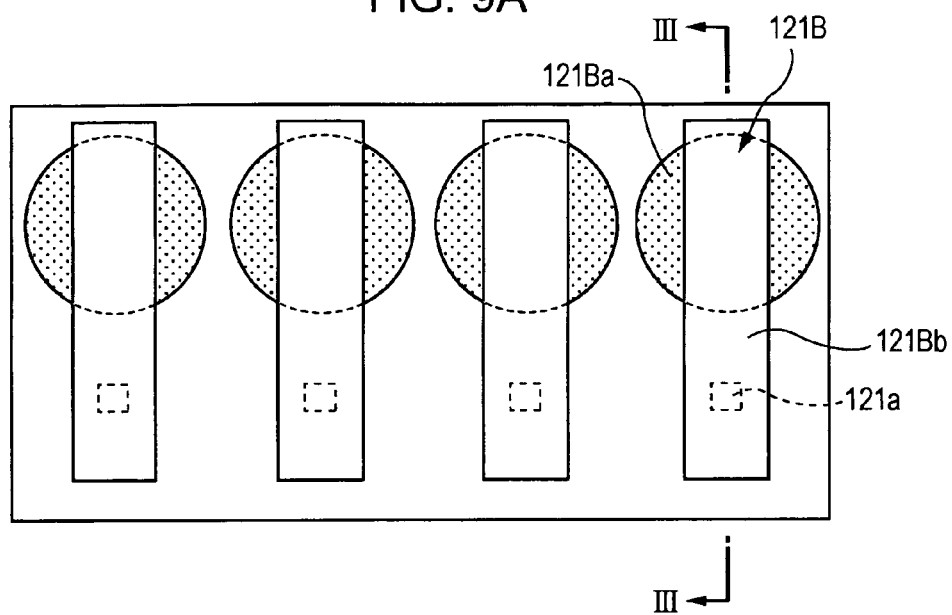
FIG. 9A is a plan view showing the electronic component according to the embodiment of the invention.
Figure 9B:
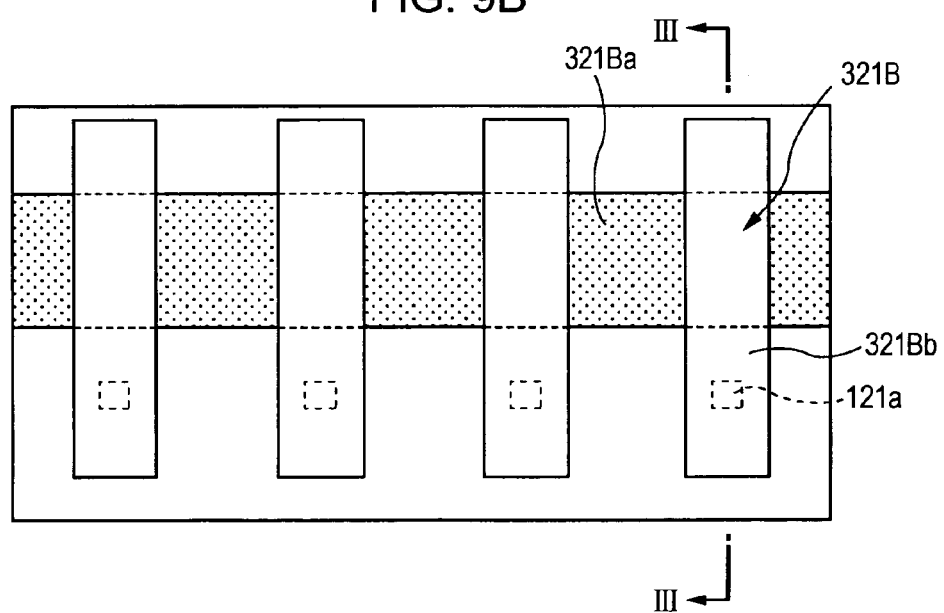
FIG. 9B is a plan view showing a second variation example of the electronic component according to the embodiment of the invention.

FIG. 9A is a plan view showing the electronic component according to the embodiment of the invention, and FIG. 9B is a plan view showing a second variation example of the electronic component according to the embodiment of the invention. Additionally, the lateral cross-sectional view of the electronic component shown in FIG. 3 is taken along the line III—III of FIG. 9A or the line III—III of FIG. 9B. As shown in FIGS. 3 and 9A, the resin projection 121Ba in this embodiment is formed in a semispherical shape. As shown in FIGS. 3 and 9B, a resin projection 321Ba may be formed in a semicolumnar shape and disposed in the array direction of terminal electrodes 121*a*. In such a case, a plurality of conductive films 321Bb conductively connected to the respective terminal electrodes 121*a* extend over the surface of the same resin projection 321Ba, thus constituting a plurality of bump electrodes 321B. As a result, a plurality of bump electrodes 321B can be arranged at a narrow pitch.

Referring back to FIG. 3, the bump electrode 121B of the electronic component 121 is mounted through a sealing resin (second resin) 122 on the connecting terminal 111*bx* disposed on the substrate 111. The sealing resin 122 is a thermosetting resin and is in an uncured or semi-cured state before mounting. If the sealing resin 122 is in an uncured sate, the sealing resin 122 is applied to the surface (lower surface in FIG. 3) of the electronic component 121 or the surface of the substrate 111. If the sealing resin 122 is in a semi-cured state, the sealing resin 122 is formed into a film or sheet and disposed between the electronic component 121 and the substrate 111. Although an epoxy resin is generally used as the sealing resin 122, other resin may be used as long as the same effect is achieved.

The electronic component 121 is mounted while pressing the electronic component 121 to the substrate 111 under heat using a hot press head or the like (not shown). The sealing resin 122 is softened in the initial stage of heating, and the top of the bump electrode 121B is brought into conductive contact with the connecting terminal 111bx in such a manner that the softened resin is pushed aside. When heating is continued in a state shown in FIG. 4, the sealing resin 122 is cured by crosslinking at a predetermined temperature to fix the relative positions of the electronic component 121 and the substrate 111. As a result, the conductive contact between the bump electrode 121B and the connecting terminal 111bx can be maintained.

(Heights of Resin Projection and Sealing Resin)

Figure 5:
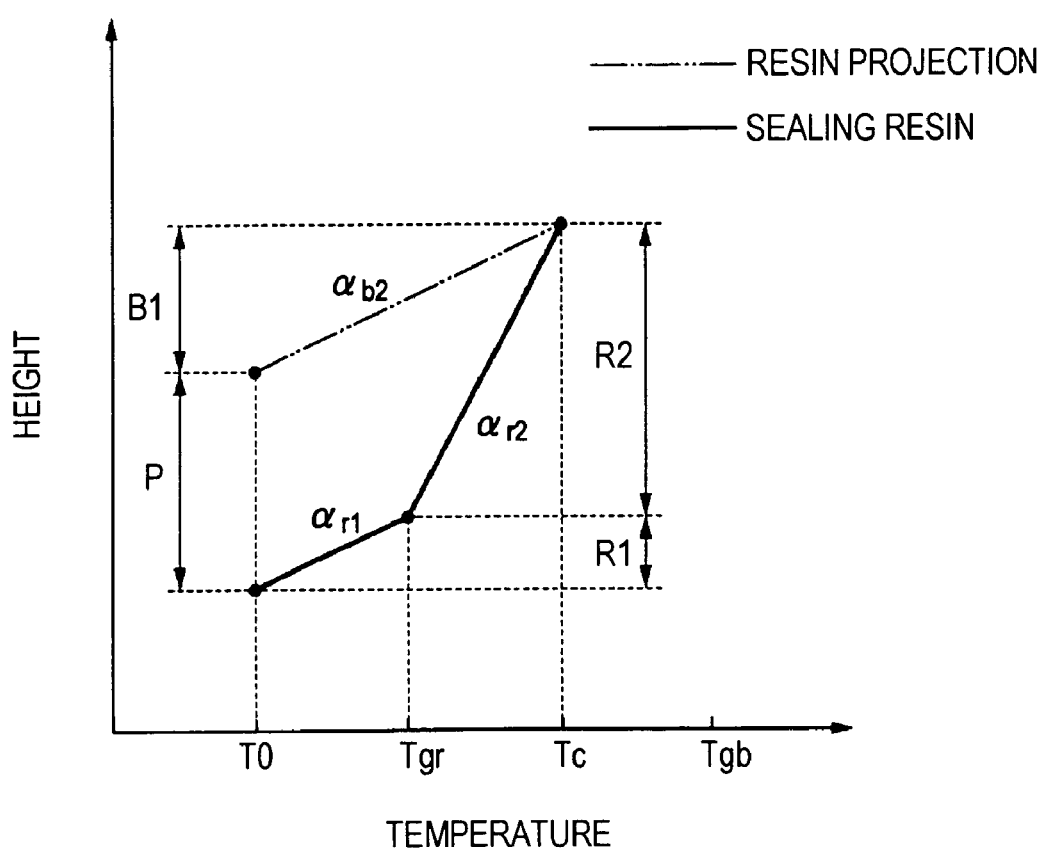
FIG. 5 is a graph which shows a relationship between the temperature and the free height of a resin projection and the height of a sealing resin.
Figure 6:
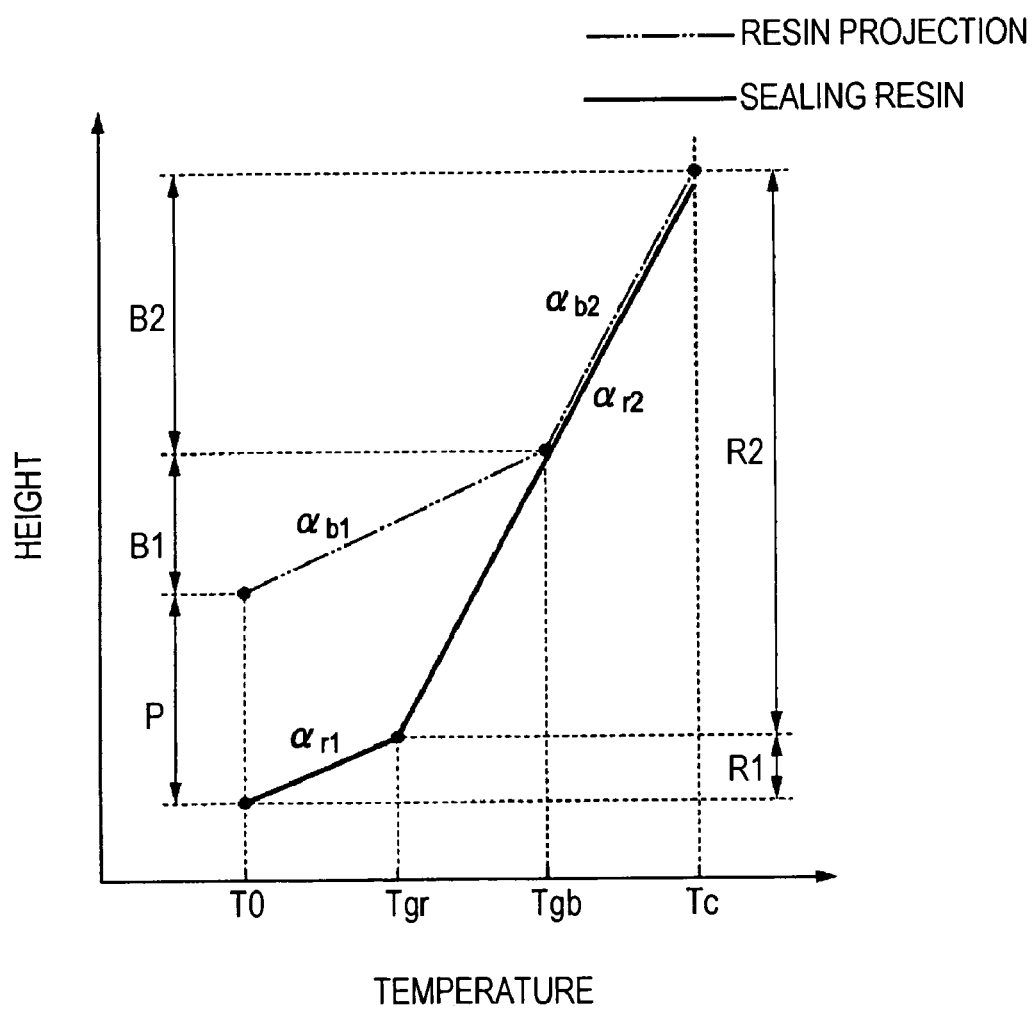
FIG. 6 is a graph which shows a relationship between the temperature and the free height of a resin projection and the height of a sealing resin.

FIGS. 5 and 6 each are a graph which shows a relationship between the temperature and the free height of a resin projection and the height of a sealing resin. Herein, the free height of the resin projection is a height of the resin projection before mounting and substantially corresponds to the height H of the bump electrode 121B shown in FIG. 3. The height of the sealing resin is, as shown in FIG. 4, the height D of the sealing resin 122 filled between the surface of the protective film of the electronic component 121 and the connecting terminal 111bx of the substrate 111, and substantially corresponds to the height of the resin projection after mounting. In FIGS. 5 and 6, Tc is a curing temperature of the sealing resin, and T0 is an operating temperature of the electronic component. The operating temperature of the electronic component is defined as the temperature in a guaranteed operation range, for example, described in product specifications or instruction manuals.

In this embodiment, as described above, the top of the bump electrode of the electronic component is brought into conductive contact with the connecting terminal of the substrate, and the sealing resin is cured by heating it to the curing temperature Tc. Consequently, as shown in FIGS. 5 and 6, at the curing temperature Tc of the sealing resin, the free height of the resin projection is substantially the same as the height of the sealing resin. On the other hand, the electronic component after mounting is used at an operating temperature T0 that is lower than the curing temperature Tc of the sealing resin. When an epoxy resin is employed as the sealing resin, the curing temperature Tc is about 240° C., and the operating temperature T0 is about 25° C. During the cooling process, both the resin projection and the sealing resin contract, and therefore, it is important to ensure the conductive contact between the bump electrode and the connecting terminal.

A commonly used resin material undergoes glass transition due to cooling. The term "glass transition" refers to the change in which a substance, such as glass, that is liquid at high temperatures rapidly increases its viscosity in a certain temperature range due to a decrease in temperature and substantially loses fluidity to become an amorphous solid. A glass transition temperature is the temperature at which glass transition occurs. In this embodiment, the glass transition temperature Tgb of an acrylic resin or a phenol resin constituting the resin projection is about 200° C. to 250° C., and the glass transition temperature Tgr of an epoxy resin constituting the sealing resin is about 150° C. to 180° C. That is, both the glass transition temperature Tgb of the resin projection and the glass transition temperature Tgr of the sealing resin are higher than the operating temperature T0 (T0<Tgr<Tgb). Furthermore, the glass transition temperature Tgb of the resin projection may be higher than the curing temperature Tc of the sealing resin (Tc<Tgb), or may be lower than the curing temperature Tc of the sealing resin (Tgb<Tc).

Before and after the glass transition, the thermal expansion coefficient of a substance sharply changes. In this embodiment, the thermal expansion coefficient $\alpha b2$ of an acrylic resin or a phenol resin constituting the resin projection above the glass transition temperature Tgb is about 100 to 300 ppm/° C., and the thermal expansion coefficient $\alpha b1$ below the glass transition temperature Tgb is about 20 to 80 ppm/° C. The thermal expansion coefficient $\alpha r2$ of an epoxy resin constituting the sealing resin above the glass transition temperature Tgr and the thermal expansion coefficient $\alpha r1$ below the glass transition temperature Tgr are substantially in the same levels as those described above. That is, with respect to the commonly used resin material, there is a difference by an order of magnitude in the thermal expansion coefficient before and after glass transition.

As described above, since there is a large difference in thermal expansion coefficient before and after glass transition, there is a large difference in contraction rate before and after glass transition with respect to the resin projection and the sealing resin. Consequently, depending on the relationship between the glass transition temperatures of the resin projection and the sealing resin, the curing temperature of the sealing resin, and the operating temperature, the conductive contact between the bump electrode and the connecting terminal greatly changes. Therefore, the conductive contact between the bump electrode and the connecting terminal will be examined case-by-case, according to the relationship between the glass transition temperature Tgb of the resin projection, the glass transition temperature Tgr of the sealing resin, the curing temperature Tc of the sealing resin, and the operating temperature T0.

FIG. 5 is a graph which shows a relationship between the temperature and the free height of a resin projection and the height of a sealing resin in the case of T0<Tgr<Tc<Tgb (Formula 1). In this case, the change in height (amount of contraction) of the sealing resin in the cooling process from the curing temperature Tc of the sealing resin during mounting to the operating temperature T0 after mounting is expressed by the following formula:

$$R2+R1=\alpha r2(Tc-Tgr)+\alpha r1(Tgr-T0) \quad \text{(Formula 2)}$$

The change in free height (amount of contraction) of the resin projection in the same cooling process is expressed by the following formula:

$$B1=\alpha b1(Tc-T0) \quad \text{(Formula 3)}$$

The difference P between the free height of the resin projection and the height of the sealing resin at the operating temperature T0 corresponds to a compressive (elastic) deformation of the resin projection at the operating temperature T0. If the compressive deformation is positive, the bump electrode is pressed against the connecting terminal, and thus satisfactory conductive contact is ensured. Consequently, in order to secure satisfactory conductive contact in the operating environment, the relationship 0<P=(R2+R1)−B1 must be satisfied. By substituting Formula 2 and Formula 3 into the above relationship, the following formula is obtained:

$$\alpha b1(Tc-T0)<\alpha r2(Tc-Tgr)+\alpha r1(Tgr-T0) \quad \text{(Formula 4)}$$

That is, in the case of Formula 1, the materials for the resin projection and the sealing resin must be selected so as to satisfy Formula 4.

FIG. 6 is a graph which shows a relationship between the temperature and the free height of a resin projection and the height of a sealing resin in the case of T0<Tgr<Tgb<Tc (Formula 5). In this case, the change in height (amount of contraction) of the sealing resin in the cooling process from the curing temperature Tc of the sealing resin during mounting to the operating temperature T0 after mounting is expressed by the following formula:

$$R2+R1=\alpha r2(Tc-Tgr)+\alpha r1(Tgr-T0) \quad \text{(Formula 6)}$$

The change in free height (amount of contraction) of the resin projection in the same cooling process is expressed by the following formula:

$$B2+B1=\alpha b2(Tc-Tgb)+\alpha b1(Tgb-T0) \quad \text{(Formula 7)}$$

In order to secure satisfactory conductive contact in the operating environment, the relationship 0<P=(R2+R1)−(B2+B1) must be satisfied, where P is a difference between the free height of the resin projection and the height of the sealing resin at the operating temperature T0. By substituting Formula 6 and Formula 7 into the above relationship, the following formula is obtained:

$$\alpha b2(Tc-Tgb)+\alpha b1(Tgb-T0)<\alpha r2(Tc-Tgr)+\alpha r1(Tgr-T0) \quad \text{(Formula 8)}$$

That is, in the case of Formula 5, the materials for the resin projection and the sealing resin must be selected so as to satisfy Formula 8.

Furthermore, in the case of T0<Tc<Tgr<Tgb (Formula 9), during the cooling process from the curing temperature Tc of the sealing resin to the operating temperature T0 of the electronic component, contraction occurs with the free height of the resin projection and the height of the sealing resin being substantially equal to each other. Consequently, conductive contact can also be ensured at the operating temperature T0. Furthermore, when the thermal expansion coefficient $\alpha r1$ of the sealing resin below the glass transition temperature Tgr is larger than the thermal expansion coefficient $\alpha b1$ of the resin projection below the glass transition temperature Tgb ($\alpha b1<\alpha r1$), in the same cooling process, the contraction rate of the sealing resin becomes larger than the contraction rate of the resin projection. Consequently, at the operating temperature T0, the bump electrode is pressed against the connecting terminal, and it is possible to improve reliability of electrical connection.

As described above, in the case of any one of Formula 1, Formula 5, and Formula 9, conductive contact can be secured in the operating environment. Consequently, regardless of the relationship between the curing temperature Tc of the sealing resin, the glass transition temperature Tgb of the resin projection, and the glass transition temperature Tgr of the sealing resin, if the relationship T0<Tgr<Tgb is satisfied, it is almost always possible to secure conductive contact in the operating environment.

In this embodiment, the sealing resin is cured while the bump electrode is being brought into conductive contact with the connecting terminal. In the resulting mounted structure, the resin projection is not compressively deformed.

Figure 7:
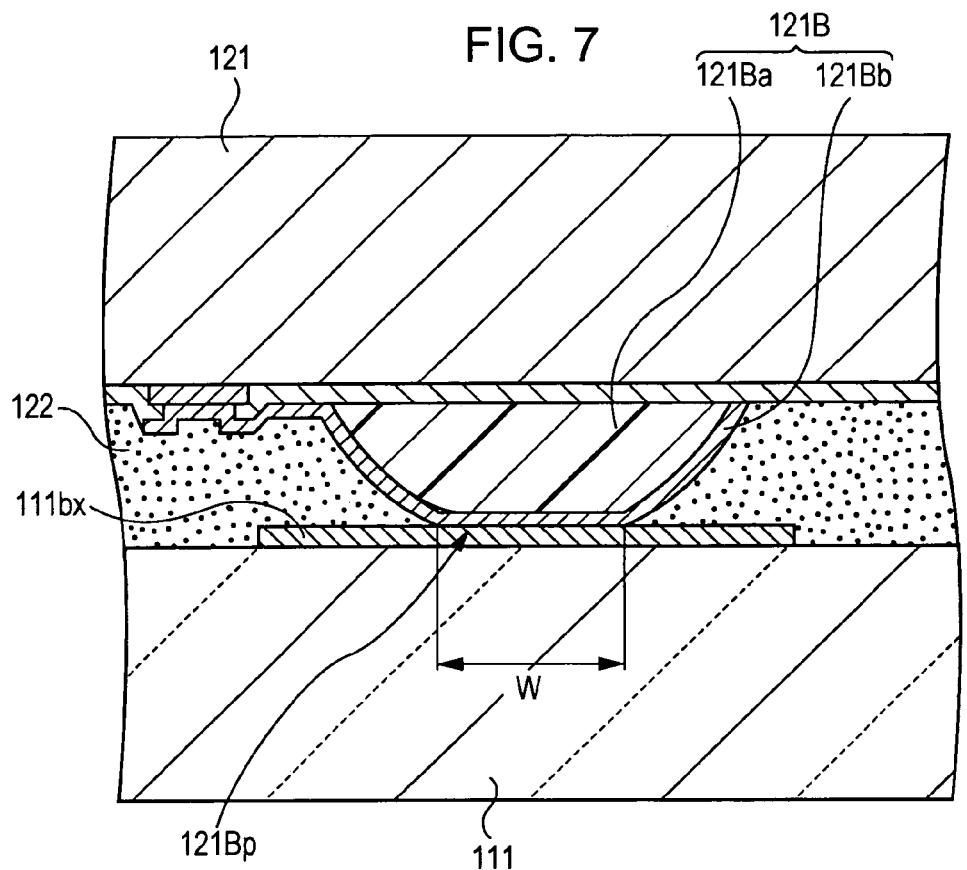
FIG. 7 is a lateral cross-sectional view showing an electronic component-mounted structure in which a bump electrode has been initially compressed.

FIG. 7 is a lateral cross-sectional view showing an electronic component-mounted structure in which a bump electrode has been initially compressed. As shown in FIG. 7, the sealing resin 122 may be cured with the resin projection 121Ba being compressively deformed to fix the relative positions of the electronic component 121 and the substrate 111. In such a case, in each of the graphs of FIGS. 5 and 6, the free height of the resin projection shifts upward, and the difference P between the free height of the resin projection and the height of the sealing resin at the operating temperature T0 increases. Consequently, in the operating environment, the bump electrode is strongly pressed against the connecting terminal, and it is possible to improve reliability of electrical connection.

As shown in FIG. 4, when the bump electrode 121B is not initially compressed, point contact occurs between the bump electrode 121B and the connecting terminal 111bx. In contrast, as shown in FIG. 7, when the bump electrode 121B is initially compressed, planar contact occurs between the bump electrode 121B and the connecting terminal 111bx. Furthermore, when the substrate 111 is a transparent substrate, such as a glass substrate, it is possible to confirm whether the bump electrode 121B is initially compressed by observing a contact portion 121Bp from outside the substrate. As a result, it is possible to improve reliability of electrical connection. Moreover, it is possible to further improve reliability of conductive contact by measuring and controlling the diameter W of the contact portion 121Bp.

[Electronic Apparatuses]

Figure 10:
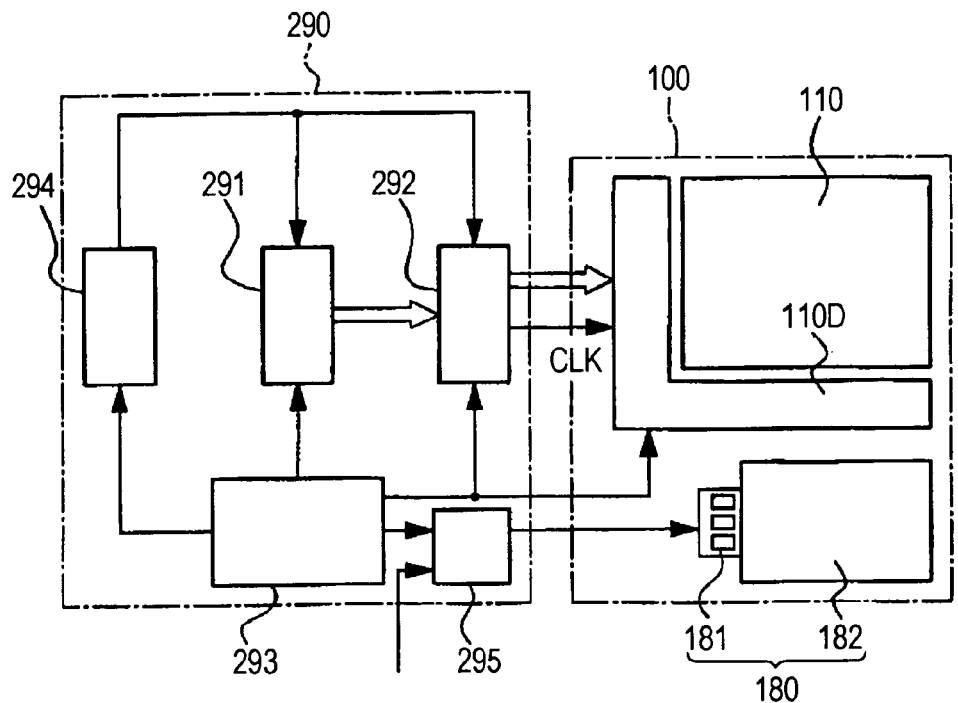
FIG. 10 is a schematic diagram showing an overall structure of a display control system in an electronic apparatus according to an embodiment of the invention.

Lastly, with reference to FIGS. 10 and 11, electronic apparatuses according to an embodiment of the invention will be described. In this embodiment, an electronic apparatus including the electro-optical device (liquid crystal device 100) described above will be described. FIG. 10 is a schematic diagram showing an overall structure of a control system (display control system) for the liquid crystal device 100 in an electronic apparatus in this embodiment. The electronic apparatus has a display control circuit 290, which includes a display information output source 291, a display information processing circuit 292, a power supply circuit 293, a timing generator 294, and a light source control circuit 295. The liquid crystal device 100 is provided with a driving circuit 110D for driving a liquid crystal panel 110 which has the structure described above. The driving circuit 110D includes a semiconductor IC chip that is directly mounted on the liquid crystal panel 110 as described above. Besides the structure described above, the driving circuit 110D may include a circuit pattern formed on the surface of the panel, or a semiconductor IC chip or a circuit pattern mounted on a circuit board conductively connected to the liquid crystal panel.

The display information output source 291 includes a memory, such as read only memory (ROM) or random access memory (RAM), a storage unit, such as a magnetic recording disk or an optical recording disk, and a tuning circuit that tunes digital picture signals. The display information output source 291 supplies the display information to the display information processing circuit 292 based on various clock signals generated by the timing generator 294 in the form of picture signals or the like having a predetermined format.

The display information processing circuit 292 includes various known circuits, such as a serial-parallel converting circuit, an amplifying and inverting circuit, a rotation circuit, a gamma correction circuit, and a clamping circuit. The display information processing circuit 292 processes input display information and supplies the image information to the driving circuit 110D together with clock signals CLK. The driving circuit 110D includes a scanning line driving circuit, a signal line driving circuit, and an inspection circuit. The power supply circuit 293 supplies predetermined voltages to the individual constituent elements.

Based on the control signals introduced from the outside, the light source control circuit 295 supplies electric power, which is supplied from the power supply circuit 293, to a light source unit 181 (specifically, light-emitting diodes) of an illuminating apparatus 180. The light source control circuit 295 controls turning on/off of the respective light sources of the light source unit 181 according to the control signals. It is also possible to control the luminance of the respective light sources. Light released from the light source unit 181 is applied to the liquid crystal panel through a light guide plate 182.

Figure 11:
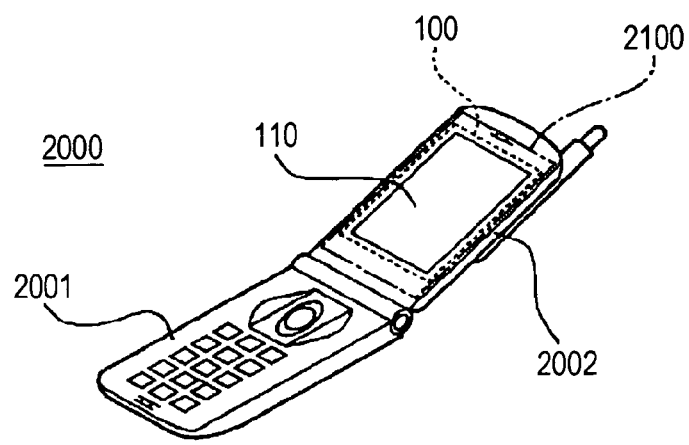
FIG. 11 is a perspective view of a mobile phone.
Figure 12:
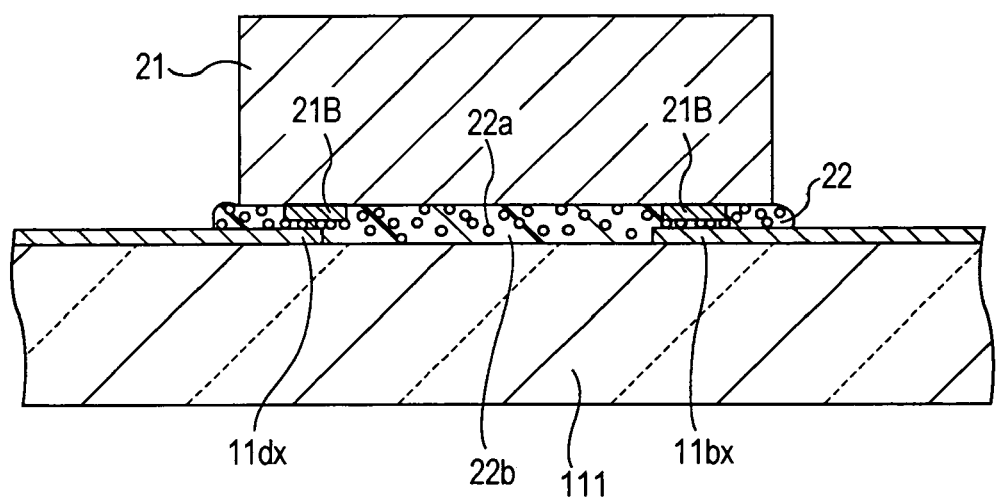
FIG. 12 is a lateral cross-sectional view showing an electronic component-mounted structure in the related art.

FIG. 11 is a perspective view of a mobile phone, which is an example of the electronic apparatus according to the embodiment of the invention. A mobile phone 2000 includes an operation unit 2001 and a display unit 2002, and a circuit board 2100 is disposed in the display unit 2002. The liquid crystal device 100 described above is mounted on the circuit board 2100. The liquid crystal panel 110 is visible at the surface of the display unit 2002.

Besides the passive matrix liquid crystal display device described above, the electro-optical device according to the embodiment of the invention can also be applied to an active matrix liquid crystal display device, for example, a liquid crystal display device including thin-film transistors (TFTs) or thin-film diodes (TFDs) serving as switching elements. Furthermore, examples of the electro-optical device according to the embodiment of the invention include a device having an electro-optical effect in which the refractive index of a substance is changed by an electric field to cause a change in transmittance of light, and a device that converts electrical energy into optical energy. That is, the invention can be widely applied to not only liquid crystal display devices but also light-emitting devices, such as organic EL devices, inorganic EL devices, plasma display devices, electrophoresis display devices, and displays using electron-emitting elements (e.g., field emission displays and surface-conduction electron-emitter displays).

The entire disclosure of Japanese Patent Application No. 2004-274625, filed Sep. 22, 2005, is expressly incorporated by reference herein.

What is claimed is:

1. An electronic component-mounted structure comprising:
   a substrate having a connecting terminal;
   an electronic component separated from the substrate by a space, the electronic component having an operating temperature of $T0$;
   a bump electrode formed on the electronic component, the bump electrode including a protection made of a first resin and a conductive film covering at least a top of the protection, the conductive film abutting against the connecting terminal of the substrate, the first resin having a glass transition temperature of $Tgb$; and
   a second resin filling the space between the electronic component and the substrate, the second resin having a glass transition temperature of $Tgr$, wherein $T0<Tgr<Tgb$,
   wherein the second resin has a curing temperature of $Tc$ such that $T0<Tgr<Tc<Tgb$, and
   wherein the following relationship is satisfied:

$$\alpha b1(Tc-T0)<\alpha r2(Tc-Tgr)+\alpha r1(Tgr-T0),$$

wherein $\alpha b1$ is a thermal expansion coefficient of the first resin below the glass transition temperature $Tgb$,
   $\alpha r2$ is a thermal expansion coefficient of the second resin above the glass transition temperature $Tgr$, and
   $\alpha r1$ is a thermal expansion coefficient of the second resin below the glass transition temperature $Tgr$.

2. The electronic component-mounted structure according to claim 1, wherein the relationship $ab<\alpha r1$ is satisfied.

3. An electro-optical device comprising the electronic component-mounted structure according to claim 1.

4. An electronic apparatus comprising the electro-optical device according to claim 3.

5. An electronic component-mounted structure comprising:
   a substrate having a connecting terminal;
   an electronic component separated from the substrate by a space, the electronic component having an operating temperature of $T0$;
   a bump electrode formed on the electronic component, the bump electrode including a protection made of a first resin and a conductive film covering at least a top of the protection, the conductive film abutting against the connecting terminal of the substrate, the first resin having a glass transition temperature of $Tgb$; and
   a second resin filling the space between the electronic component and the substrate, the second resin having a glass transition temperature of $Tgr$, wherein $T0<Tgr<Tgb$,
   wherein the second resin has a curing temperature of $Tc$ such that $T0<Tgr<Tc<Tgb$, and
   wherein the following relationship is satisfied $$\alpha b2(Tc-Tgb)+\alpha b1(Tgb-T0)<\alpha r2(Tc-Tgr)+\alpha r1(Tgr-T0),$$

where $\alpha b2$ is a thermal expansion coefficient of the first resin above the glass transition temperature $Tgb$,
   $\alpha b1$ is a thermal expansion coefficient of the first resin below the glass transition temperature $Tgb$,
   $\alpha r2$ is a thermal expansion coefficient of the second resin above the glass transition temperature $Tgr$, and
   $\alpha r1$ is a thermal expansion coefficient of the second resin below the glass transition temperature $Tgr$.

6. An electro-optical device comprising the electronic component-mounted structure according to claim 5.

7. An electronic apparatus comprising the electro-optical device according to claim 6.

* * * * *